(12) United States Patent
Orr et al.

(10) Patent No.: US 6,759,907 B2
(45) Date of Patent: Jul. 6, 2004

(54) DISTRIBUTED LEVEL-SHIFTING NETWORK FOR CASCADING BROADBAND AMPLIFIERS

(75) Inventors: Jerry Orr, Santa Rosa, CA (US); Tim Bagwell, Rohnert Park, CA (US)

(73) Assignee: Centellax, Inc., Santa Rosa, CA (US)

(*) Notice: Subject to any disclaimer, the term of this patent is extended or adjusted under 35 U.S.C. 154(b) by 0 days.

(21) Appl. No.: 10/351,602

(22) Filed: Jan. 24, 2003

(65) Prior Publication Data

US 2004/0027202 A1 Feb. 12, 2004

Related U.S. Application Data

(60) Provisional application No. 60/351,976, filed on Jan. 25, 2002.

(51) Int. Cl.[7] .............................. H03F 3/60; H03F 3/68; H03F 3/04
(52) U.S. Cl. ...................... 330/286; 330/295; 330/296; 330/54
(58) Field of Search ................................ 330/286, 295, 330/296, 54

(56) References Cited

U.S. PATENT DOCUMENTS

| | | | |
|---|---|---|---|
| 4,543,535 A | | 9/1985 | Ayasli |
| 5,227,734 A | * | 7/1993 | Schindler et al. ............. 330/54 |
| 5,414,387 A | * | 5/1995 | Nakahara et al. ............. 330/54 |
| 5,550,513 A | | 8/1996 | Wong |
| 6,215,360 B1 | * | 4/2001 | Callaway, Jr. ............. 330/310 |
| 6,377,125 B1 | | 4/2002 | Pavio et al. |
| 6,400,226 B2 | * | 6/2002 | Sato ........................... 330/286 |

OTHER PUBLICATIONS

PCT International Search Report, International Application No. PCT/US03/02332, Jun. 9, 2003, 4 pages.

* cited by examiner

*Primary Examiner*—Patricia Nguyen
(74) *Attorney, Agent, or Firm*—Fenwick & West LLP

(57) ABSTRACT

A distributed and adjustable level-shifting network is integrated with cascaded amplifiers, eliminating the need for a direct current (dc) blocking capacitor between the amplifiers. The level-shifting network can be adjusted to compensate for process variations and to balance the crossover frequency response of the cascaded amplifiers.

25 Claims, 10 Drawing Sheets

DISTRIBUTED LEVEL-SHIFTING NETWORK FOR CASCADING BROADBAND AMPLIFIERS

CROSS-REFERENCE TO RELATED APPLICATION

This application claims the benefit of U.S. Provisional Application No. 60/351,976, filed Jan. 25, 2002, which application is incorporated by reference herein.

BACKGROUND

1. Field of the Invention

The present invention relates generally to the field of electronic components for optical and broadband communication systems, and more particularly to techniques implement in integrated circuit (IC) technology for cascading broadband amplifiers while preserving their broadband frequency response.

2. Background

Amplifiers used in optical and broadband communication systems typically need to amplify low frequency signals. This requirement makes cascading two or more broadband amplifiers difficult and expensive since a large capacitor is required to block the direct current (dc) bias of the output of one amplifier stage from the input of the subsequent amplifier stage. This blocking capacitor must be large enough (e.g., high capacitance) to pass the full frequency range of the cascaded amplifiers, which can extend down to dc.

Unfortunately, a large capacitor presents various problems that make cascading broadband amplifiers difficult and expensive to implement in certain IC technologies, such as Monolithic Microwave Integrated Circuit (MMIC) technology. To address these problems, several conventional techniques for implementing cascaded broadband amplifiers using IC technology have been proposed.

A first technique uses a large off-chip capacitor in between the amplifier stages. The large physical size of a capacitor capable of passing the required frequency range has significant parasitic effects that make it difficult to design properly.

A second technique uses a small coupling capacitor between the high frequency amplifier stages to pass the high frequencies, and an off-chip parallel path low frequency amplifier to provide dc restoration. The use of a parallel path amplifier requires near perfect match of phase and amplitude through the crossover network, which is difficult to achieve in practice.

A third technique uses a small coupling capacitor and an off-chip high gain feedback amplifier to raise the input impedance of the subsequent amplifier stage at low frequencies. With this technique it is difficult to achieve the high resistor-capacitor (RC) constant required for low frequencies (i.e., KHz range).

Accordingly, a solution is needed for providing adjustable, dc level-shifting capability in a distributed amplifier without using a blocking capacitor and without sacrificing the broadband frequency response of the cascaded amplifiers.

SUMMARY OF THE INVENTION

The present invention overcomes the deficiencies of conventional techniques by providing an integrated circuit comprising cascaded amplifiers integrated with an adjustable, distributed level-shifting network. The cascaded amplifiers are direct-coupled together without the use of a dc blocking capacitor. The distributed level-shifting network is coupled to one or more amplifiers in the cascade and provide the desired dc levels. The level-shifting network is adjustable through, for example, one or more variable resistors to balance the crossover frequency response of the cascaded amplifiers and/or to compensate for process variations.

In one embodiment of the present invention, the distributed level-shifting network includes a resistor-capacitor (RC) network coupled in series with a variable resistor and offset voltage supply for balancing the crossover frequency response of the cascaded amplifiers. The variable resistor can be an active device (e.g., transistor) configured to function as a variable resistor. The variable resistor can be included in each amplifier or a single variable resistor can be shared by all of the amplifiers in the cascade.

In another embodiment of the present invention, the distributed level-shifting network is coupled in shunt with the input of an amplifier and includes a level-shifting capacitor coupled in shunt with at least one diode in series with an optional coupling resistor. The level-shifting network can be coupled in series with a variable resistor and offset voltage supply for balancing the crossover frequency response of the amplifier. One or more diodes can also be added for temperature compensation. The variable resistor can be an active device (e.g., transistor) configured to function as a variable resistor. The variable resistor can be included in each amplifier or a single variable resistor can be shared by all of the amplifiers in the cascade. The variable resistor can be optionally coupled to a feedback circuit which uses sensed bias current to maintain a desired bias level over temperature.

The present invention enables two or more broadband amplifiers to be cascaded and fabricated in a single integrated circuit chip, thereby saving the expense of assembling the cascaded amplifiers in a hybrid microcircuit using a coupling capacitor. The cascaded amplifiers have improved frequency response performance due to inclusion of a distributed and adjustable level-shifting network.

DETAILED DESCRIPTION OF EMBODIMENTS

The present invention is described below using symbols and nomenclature known to those skilled in the art of integrated circuit technology. Like elements are collectively designated by a single numerical designation, and individual elements within the numerically designated set of elements are designated alphanumerically. For example, elements 100a and 100b may be referred to collectively as elements 100 or elements 100a–b.

The semiconductor devices described in the embodiments below can be any type of device, including without limitation, Bipolar Junction Transistors (BJTs), Field Effect Transistors (FETs), Pseudomorphic high electron mobility (pHEMPTs), Dual Gate Devices, and Cascode Pairs. These devices can be made of any material, including without limitation, Silicon (Si), Gallium Arsenide (GaAs), Indium Phosphate (InPh), and Gallium Nitride (GaN).

Figure 1:
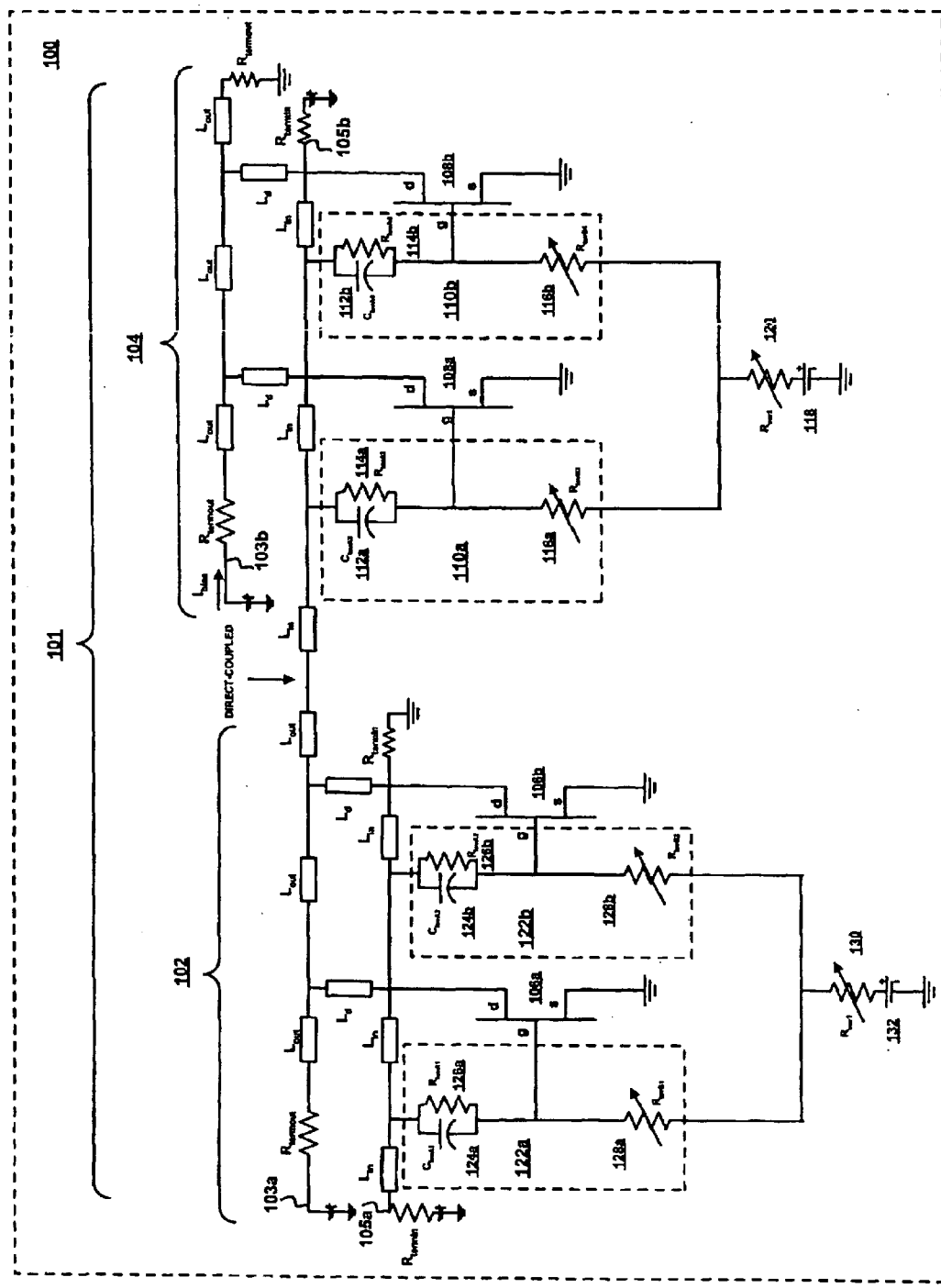
FIG. 1 is a circuit diagram of an integrated circuit, including cascaded amplifiers integrated with a distributed level-shifting network, in accordance with one embodiment of the present invention.

FIG. 1 is a circuit diagram of an integrated circuit 100, including cascaded amplifiers 101, in accordance with one embodiment of the present invention. The cascaded amplifiers 101 include an input amplifier 102 coupled to an output amplifier 104 without using a dc blocking capacitor (i.e., direct-coupled). The cascaded amplifiers 101 are not limited to two amplifiers but rather can include any number of amplifiers depending upon the application. Also, each amplifier can include any number and type of gain devices (e.g., FETs, BJTs).

In one embodiment of the present invention, the input amplifier 102 includes gain devices 106a–b and the output amplifier 104 includes gain devices 108a–b. The drain terminals d of the gain devices 106a–b are coupled to the output transmission line 103a via inductive elements $L_d$ and the gate terminals g of the gain devices 106a–b are coupled to an adjustable, level shifting networks 122a–b, respectively. The drain terminals d of the gain devices 108a–b are coupled to the output transmission line 103b via inductive elements $L_d$ and the gate terminals g of the gain devices 108a–b are coupled to level shifting networks 100a–b, respectively. Each gain device 106a–b, 108a–b, is separated from its neighboring gain device by an inductive element $L_{out}$ inserted in the output transmission lines 103a–b, and an inductive element $L_{in}$ inserted in the input transmission lines 105a–b. The inductive elements $L_{out}$, $L_d$, $L_{in}$ form an artificial line low-pass filter, which absorbs the parasitic capacitance of the gain devices 106a–b and 108a–b using known circuit techniques. In practice, these elemental inductances are implemented using a small length of high impedance transmission line. The $R_{levAi}$ resistors are used as a dc level shift. There values are chosen as not to load the characteristic impedance $Z_o$ of the input transmission line 105a, and are typically at least 10× the value of Zo. The $R_{levBi}$ resistors complete the level shifting down to a negative supply.

The level-shifting networks 122a–b, include level capacitors 124a–b ($C_{levA1}$, $C_{levA2}$) coupled in parallel to a resistors 126a–b ($R_{levA1}$, $R_{levA2}$), to form resistive-capacitive (RC) networks. The values of the resistors 126a–b are selected to provide a desired dc level shifting without loading the input transmission line 105a with excess attenuation. The level capacitors 124a–b are selected to maintain a flat frequency response down to near dc. The parallel combination of the capacitors 124a–b and the resistors 126a–b are coupled in shunt to a fixed or variable resistors 128a–b ($R_{levB1}$, $R_{levB2}$), which are coupled in series to a variable resistor 130 ($R_{var1}$). The variable resistor 130 is coupled to a voltage offset 132.

The level-shifting networks 110a–b, include level capacitors 112a–b ($C_{levA3}$, $C_{levA4}$) coupled in parallel to a resistors 114a–b ($R_{levA3}$, $R_{levA4}$), to form RC networks. The values of the resistors 114a–b are selected to provide a desired a dc level shifting without loading the input transmission line 105b with excess attenuation. The level capacitors 112a–b are selected to maintain a flat frequency response down to near dc. The parallel combination of the capacitors 112a–b and the resistors 114a–b are coupled in shunt to variable resistors 116a–b ($R_{levB3}$, $R_{levB4}$), which are coupled in series to a variable resistor 120 ($R_{var2}$). The variable resistor 120 is coupled to a voltage offset 118.

The level-shifting networks 122a–b and 110a–b provide an adjustable, dc level to the input and output amplifiers 102, 104, respectively, without using a dc blocking capacitor. The level-shifting networks 122a–b and 110a–b are adjustable via the variable resistors 116a–b, 120, 130, to compensate for IC process variations and to balance the crossover frequency response of the cascaded amplifiers 101. The operation of the level-shifting networks 122a–b and 110a–b is discussed more fully below with respect to FIG. 2.

In one embodiment, the output transmission line 103b is coupled to a sensing feedback circuit, which uses $R_{termout}$ and/or an internal or external sense resistor to sense the bias current $I_{bias}$. The sensed bias current is provided to a feedback circuit 1000 (FIG. 10) for holding the dc bias constant over temperature variations.

Figure 2:
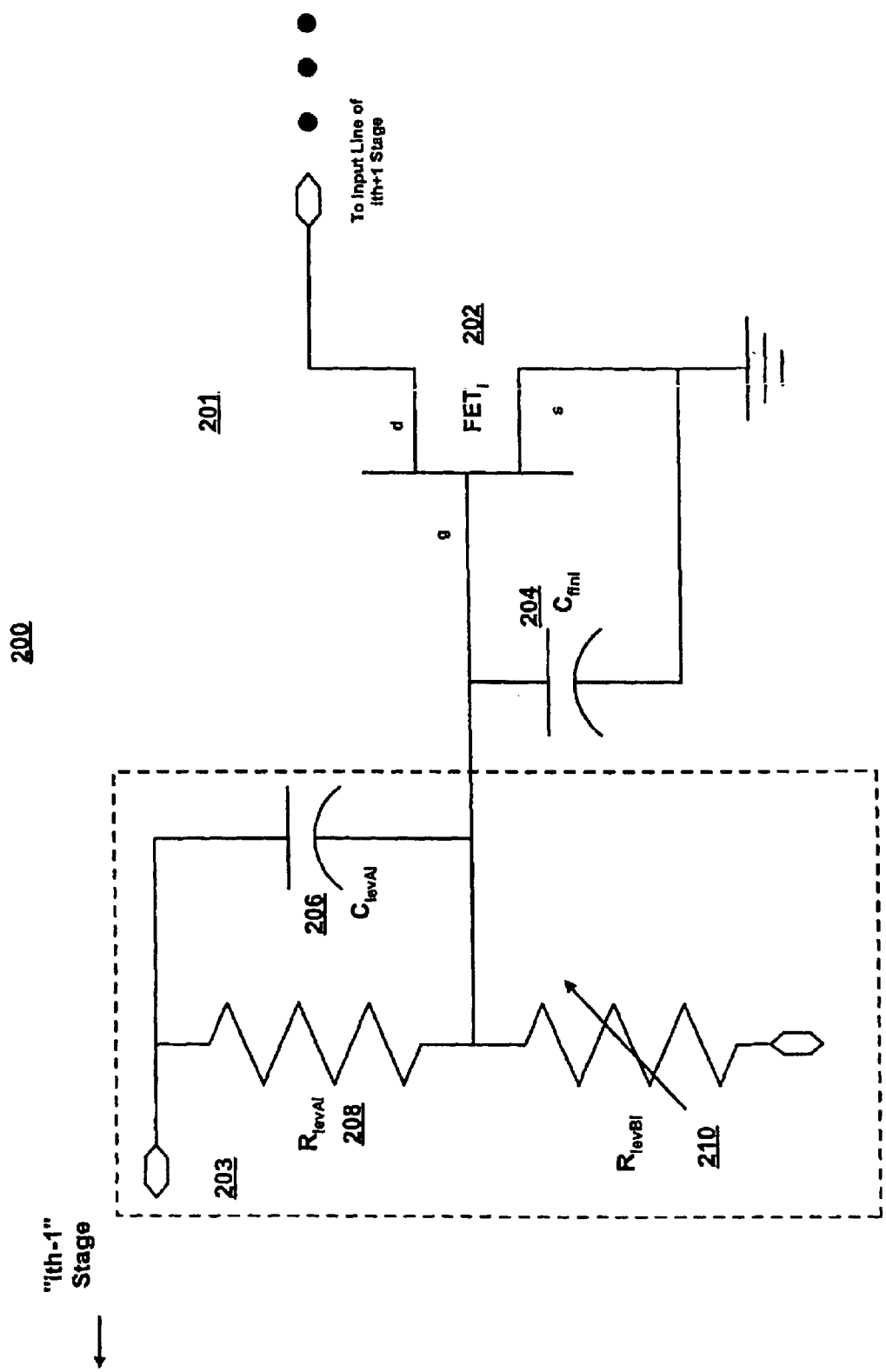
FIG. 2 is a circuit model diagram of the "ith" stage of an amplifier integrated with an adjustable, level-shifting network, in accordance with one embodiment of the present invention.

FIG. 2 is a circuit model diagram of the "ith" stage 200 of an amplifier 201 integrated with an adjustable, level-shifting network 203, in accordance with one embodiment of the present invention. The "ith" stage 200 of the amplifier 201 includes gain device 202 (e.g., a FET) having an input capacitance 204 ($C_{fin}$). The level-shifting network 203 includes a level capacitor 206 ($C_{levA}$), a resistor 208 ($R_{levA}$), and a variable resistor 210 ($R_{levBi}$). The level-shifting network 203 models the level-shifting networks 110 shown in FIG. 1.

The resistor 208 is coupled in parallel with the level capacitor 206 to form an RC network. The parallel combination of the resistor 208 and level capacitor 206 is coupled in shunt with the variable resistor 210, which is used to balance the crossover frequency response of the ith stage of the amplifier 201 as follows:

$$R_{levAi} * C_{levAi} = R_{levBi} * C_{fin_i} \qquad (1)$$

where "i" means the "ith" stage of the amplifier 201.

As can be seen from equation (1), the crossover frequency can be balanced by adjusting the variable resistor 210 ($R_{levBi}$) until the relationship described in equation (1) is achieved.

Referring back to FIG. 1, the level-shifting networks 122a–b enable direct coupling between amplifiers 102 and 104 by driving the dc bias on the drain terminals d of gain devices 106a–b to about 0 volts. For example, if the amplifiers 102, 104, each have a gain of 4 so that the gain devices 108a–b in amplifier 104 are scaled to be 4× larger than the gain devices 106a–b in amplifier 102, and the drain terminal supply voltage in amplifier 102 is 8 Volts, and it is desired to level shift it down to about 0 Volts at the gate larger than the $R_{levB}$ resistors 128a–b, thus providing a −2 Volt bias across the $R_{levB}$ resistors 128a–b to get 0 Volts at the gate terminal g of each gain device 108a–b. The values of level capacitors 124a–b in level-shifters 122a–b are preferably selected such that equation (1) is satisfied for about ¼ of the input capacitance ($C_{fin}$) of the gain devices 106a–b.

To minimize the attenuation along the input transmission line 105a, the parallel value of the $R_{levA}$ resistors 126a–b is preferably large compared to the characteristic impedance $Z_o$ of the input transmission line 105a. For an eight section distributed amplifier, this would make the $R_{levA}$ resistors 126a–b each about 8×10×$Z_o$ or about 4K Ohms, and the $R_{levB}$ resistors 128a–b each about 1K Ohm.

Figure 3:
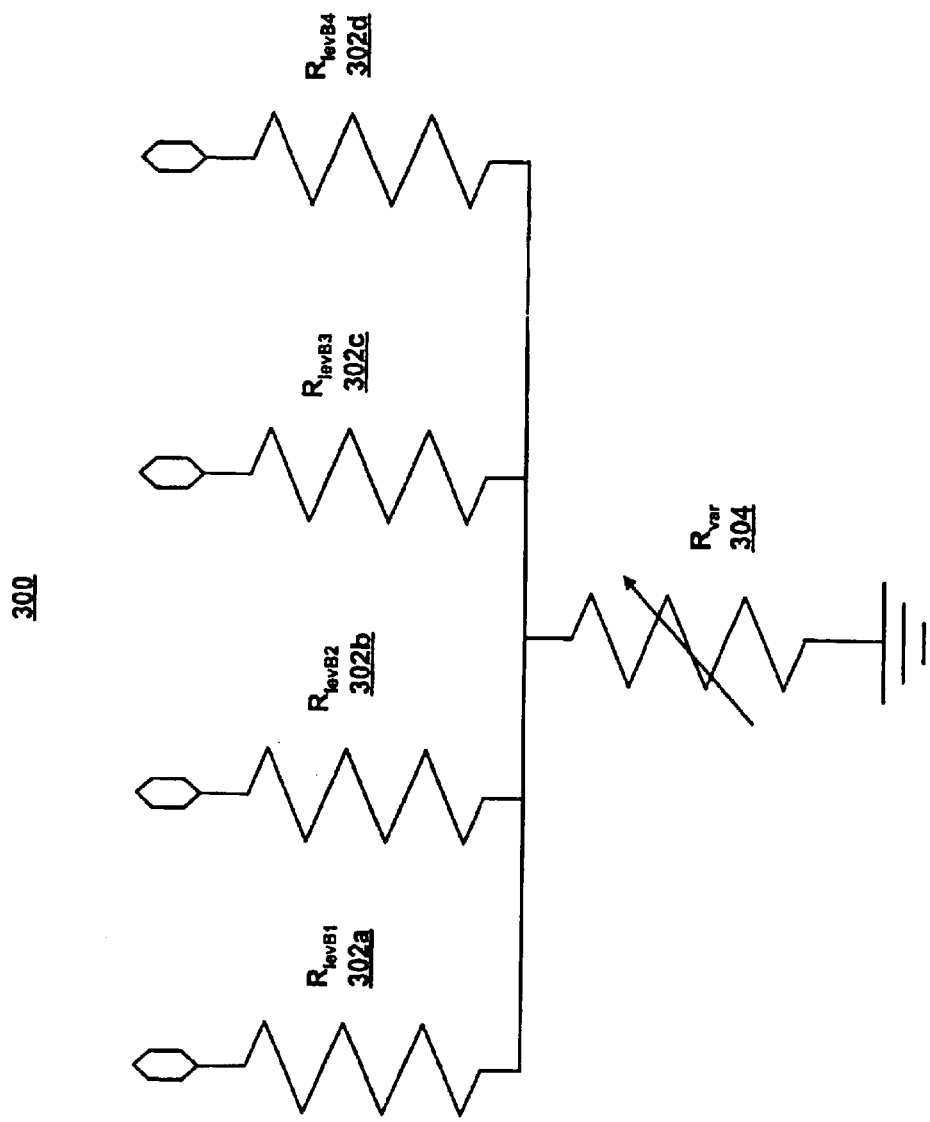
FIG. 3 is a circuit diagram of an adjustable, level-shifting network in accordance with one embodiment the present invention.

FIG. 3 is a circuit diagram of a level adjusting network 300 in accordance with one embodiment the present invention. The level adjusting network 300 includes a plurality of resistors 302a–d ($R_{levB1}$–$R_{levB4}$) and a variable resistor 304 ($R_{var}$). While only four resistors are shown in FIG. 3, any number of resistors 302a–d can be used with the present invention. The level adjusting network 300 can be used in place of the variable resistor 210 shown in FIG. 2. The variable resistor 304 in the level adjusting network 300 provides a continuous range of tuning to compensate for process variations and parasitic effects, while also providing crossover frequency balance. The level adjusting network 300 in combination with a level-shifting network (e.g., level-shifting networks 122a–b) provides level shifting with a less negative voltage applied to subsequent broadband amplifiers added to a cascade.

The crossover frequency balance is represented mathematically as follows:

$$\sum_{i=1}^{n} R_{levA_i} * C_{levA_i} = \sum_{i=1}^{n} (R_{levB_i} + n * R_{var}) * C_{fin_i}, \qquad (2)$$

where "i" means the "ith" stage of the distributed amplifier and "n" is the total number of resistors $R_{levBi}$, $R_{levBi}$.

As can be seen from equation (2), the crossover frequency can be balanced by adjusting the variable resistor 304 ($R_{var}$) until the relationship described in equation (2) is achieved.

Figure 4:
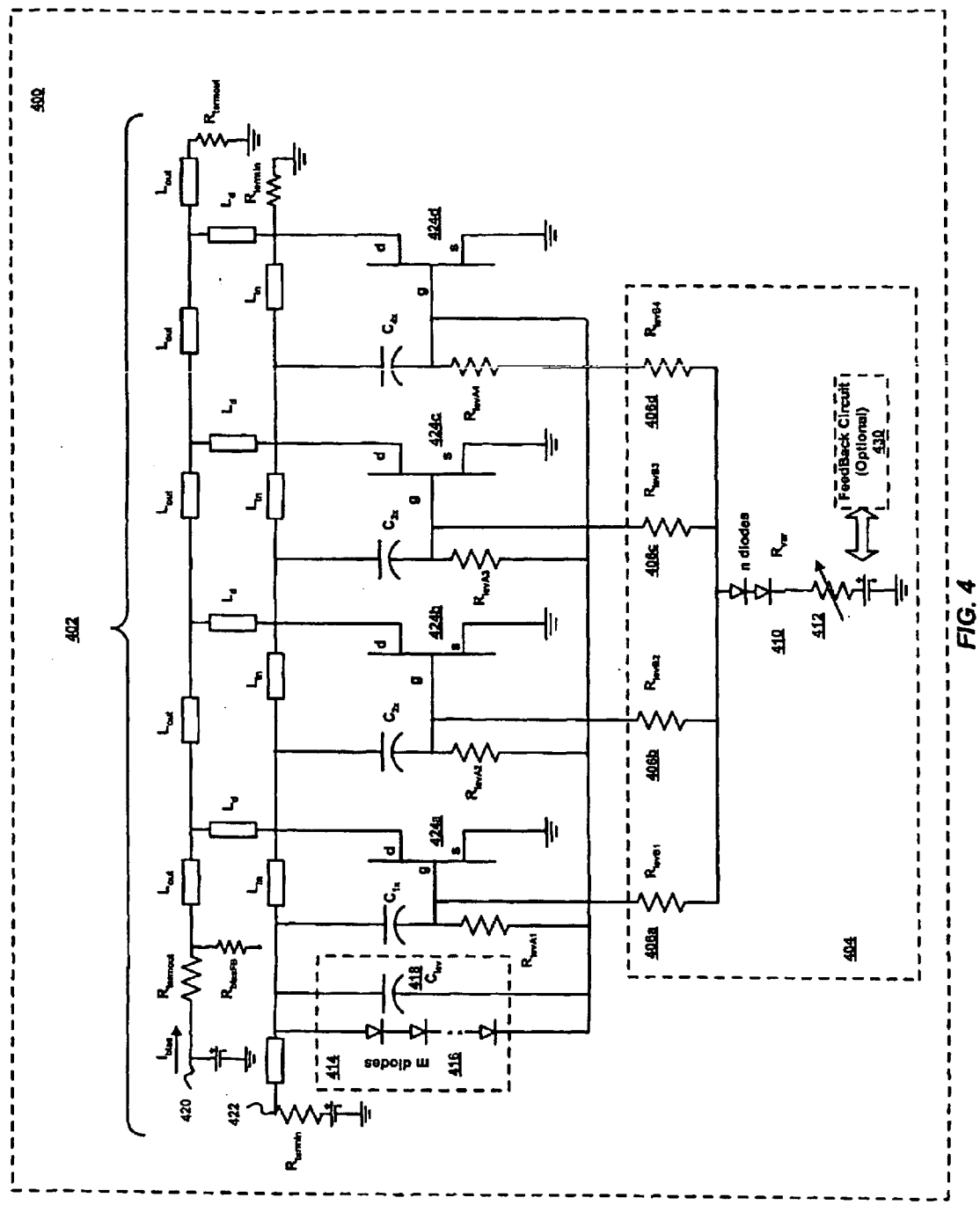
FIG. 4 is a circuit diagram of an integrated circuit, including an amplifier integrated with an adjustable, distributed level-shifting network, in accordance with one embodiment of the present invention.

FIG. 4 is a circuit diagram of an integrated circuit 400, including a broadband amplifier 402 integrated with a level adjusting network 404, in accordance with one embodiment of the present invention. The level adjusting network 404 is similar to the level adjusting network 300 shown in FIG. 3 and includes parallel resistors 406a–d ($R_{levb1}$–$R_{levB4}$) coupled in shunt with a variable resistor 410 ($R_{var}$). The variable resistor 410 is coupled to a voltage offset 412 (e.g., 1 Volt). The broadband amplifier 402 includes gain devices 424a–d, each having a drain terminal d coupled via inductive element $L_d$ to output transmission line 420 and a gate terminal g coupled to the level adjusting network 404.

A diode-capacitor level shifting network 414, including one or more series diodes 416 coupled in parallel with a level capacitor 418, is coupled in shunt to the input of the broadband amplifier 402 to provide dc level shifting in conjunction with the level adjusting network 404. The number of diodes 416 used depends upon the required value of the series resistance contributed by the diodes 416 to achieve the desired crossover frequency response.

In one embodiment, the output transmission line 420 is coupled to a sense resistor $R_{biasFB}$ to sense the bias current $I_{bias}$. The sensed current is provided to a feedback circuit 1000 (FIG. 10) for holding the dc bias constant over temperature variations.

Figure 5:
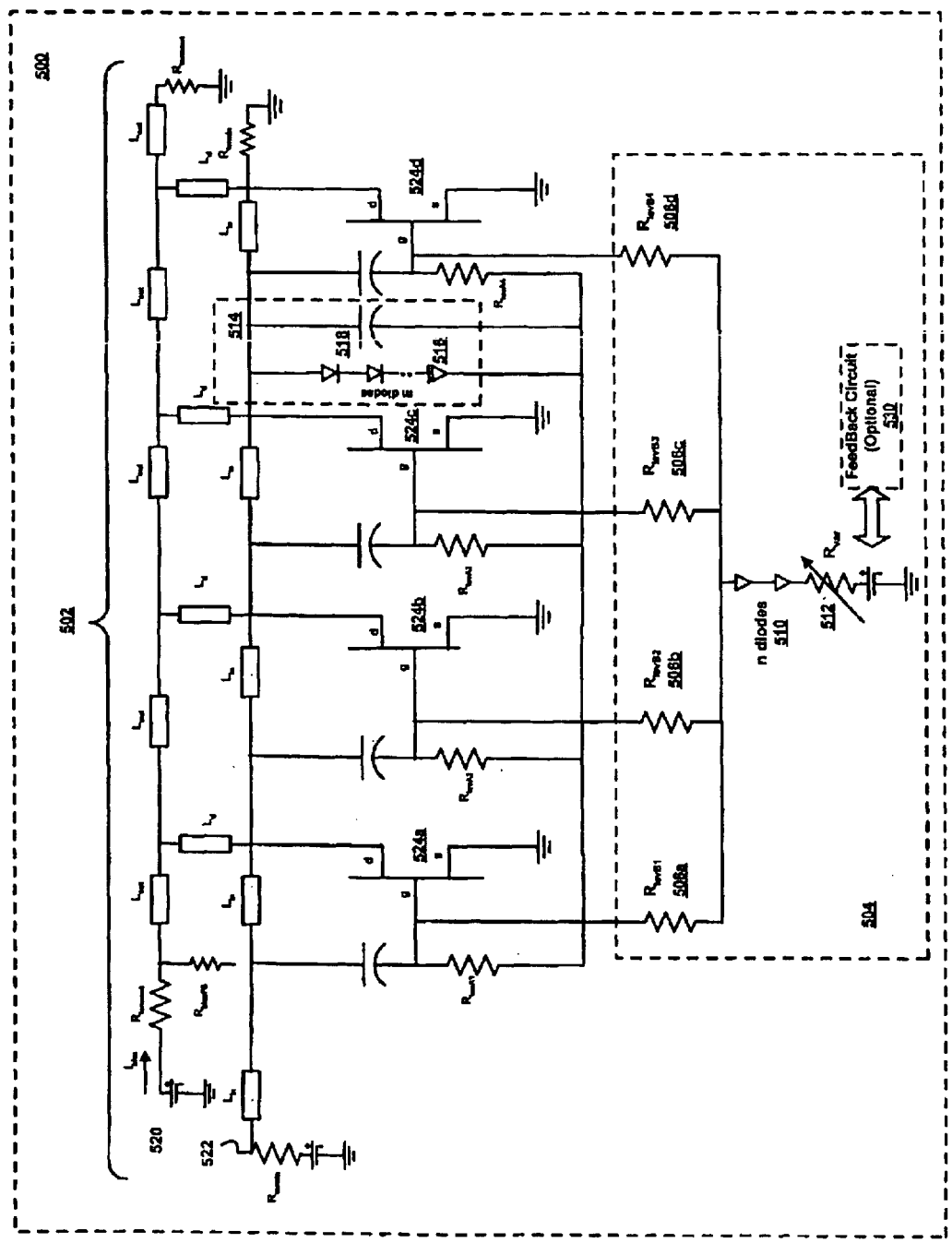
FIG. 5 is a circuit diagram of an integrated circuit, including an amplifier integrated with an adjustable, distributed level-shifting network, in accordance with one embodiment of the present invention.

FIG. 5 is a circuit diagram of an integrated circuit 500, including a broadband amplifier 502 integrated with a level adjusting network 504, in accordance with one embodiment of the present invention. The level adjusting network 504 is similar to the level adjusting network 300 shown in FIG. 3 and includes parallel resistors 506a–d ($R_{levB1}$–$R_{levB4}$) coupled in shunt with a variable resistor 510 ($R_{var}$). The variable resistor 510 is coupled to a voltage offset 512 (e.g., 1 Volt). The amplifier 502 includes gain devices 524a–d, each having a drain terminal d coupled via inductive element $L_d$ to output transmission line 520 and a gate terminal g coupled to the level adjusting network 504.

A diode-capacitor network 514, including one or more series diodes 516 coupled in parallel with a level capacitor 518, is coupled in shunt to the output of the broadband amplifier 502 to provide dc level shifting in conjunction with the level adjusting network 504. The number of diodes 516 used depends upon the required value of the series resistance contributed by the diodes 516 to achieve the desired crossover frequency response.

In one embodiment, the output transmission line 520 is coupled to a sense resistor $R_{biasFB}$ to sense the bias current $I_{bias}$. The sensed current is provided to a feedback circuit 1000 (FIG. 10) for holding the dc bias constant over temperature variations.

Figure 6:
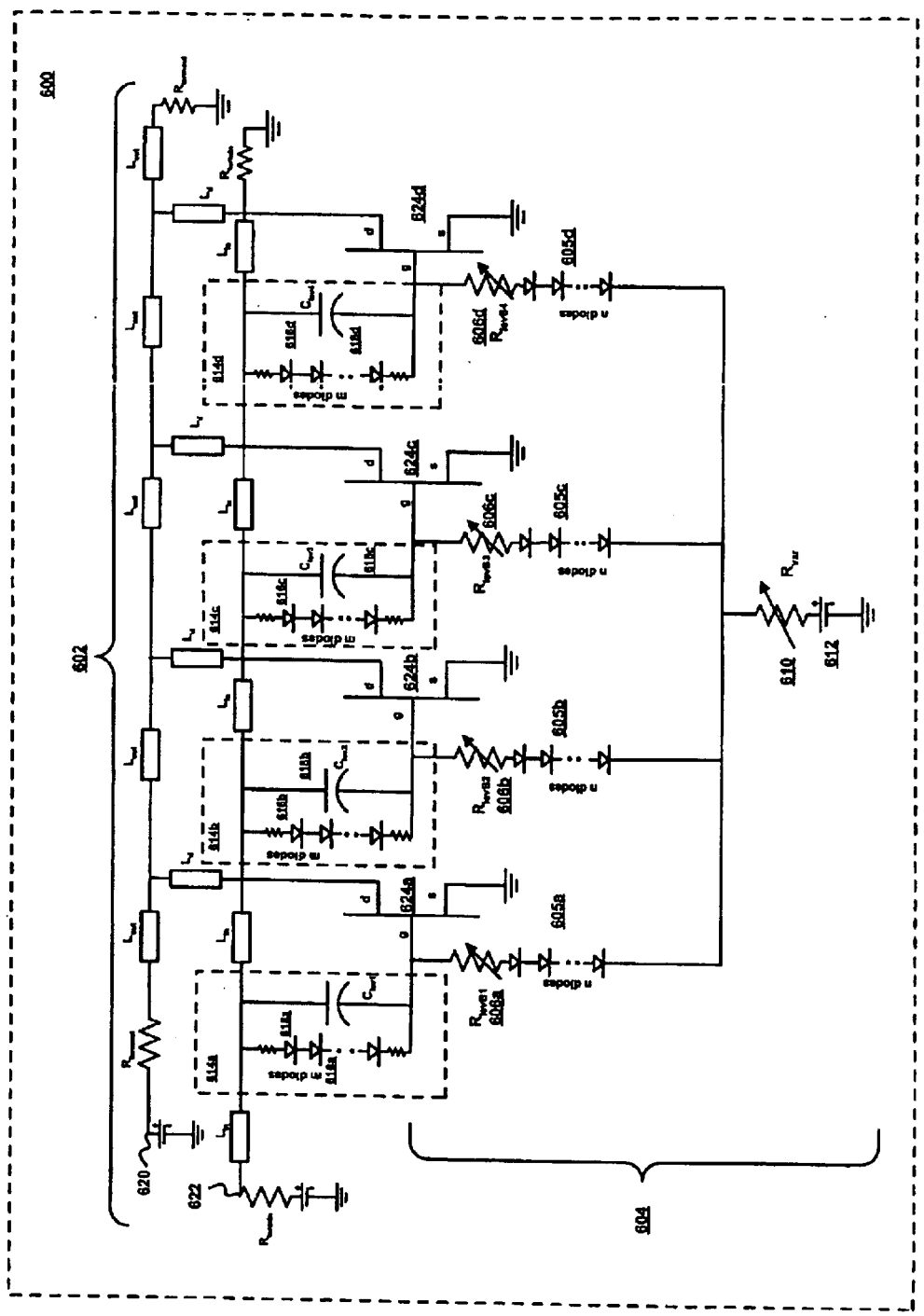
FIG. 6 is a circuit diagram of an integrated circuit, including an amplifier integrated with an adjustable, distributed level-shifting network, in accordance with one embodiment of the present invention.

FIG. 6 is a circuit diagram of an integrated circuit 600, including a broadband amplifier 602 integrated with a level adjusting network 604, in accordance with one embodiment of the present invention. The level adjusting network 604 is similar to the level adjusting network 300 shown in FIG. 3 and includes parallel resistors 606a–d ($R_{levB1}$–$R_{levB4}$) coupled in shunt with a variable resistor 610 ($R_{var}$). The variable resistor 610 is coupled to a voltage offset 612 (e.g., 1 Volt). The amplifier 602 includes gain devices 624a–d, each having a drain terminal d coupled via inductive element $L_d$ to output transmission line 620 and a gate terminal g coupled to the level adjusting network 604.

A distributed, diode-capacitor level-shifting network 614, including one or more series diodes 616a–d coupled in parallel with a level capacitors 618a–d, is coupled in shunt to the inputs of gain devices 624a–c to provide proper level shifting in conjunction with the level adjusting network 604. The number of diodes 616 ("m diodes") used by the level-shifting network 614 depends upon the required value of the series resistance contributed by the diodes 616 to achieve the desired crossover frequency response.

In one embodiment, one or more diodes 605a–d ("n diodes") are coupled in series with the resistors 606a–d, respectively, to provide temperature compensation.

In the general case, where m diodes are used with level-shifting capacitance ($C_{lev}$) and n diodes are use for temperature compensation, the crossover balance is represented mathematically as follows:

$$R_{mdiodes} = \sum_{j=1}^{m} R_{diodej}; \quad (3)$$

$$R_{ndiodes} = \sum_{j=1}^{n} R_{diodej}; \text{ and} \quad (4)$$

$$(R_{levAi} + R_{levBi} + R_{mdiodes}) \times C_{levi} = (R_{Ci} + R_{ndiodei} + nR_D) * C_{Feti}, \quad (5)$$

where "n" is the number of sections of a distributed amplifier.

Figure 7:
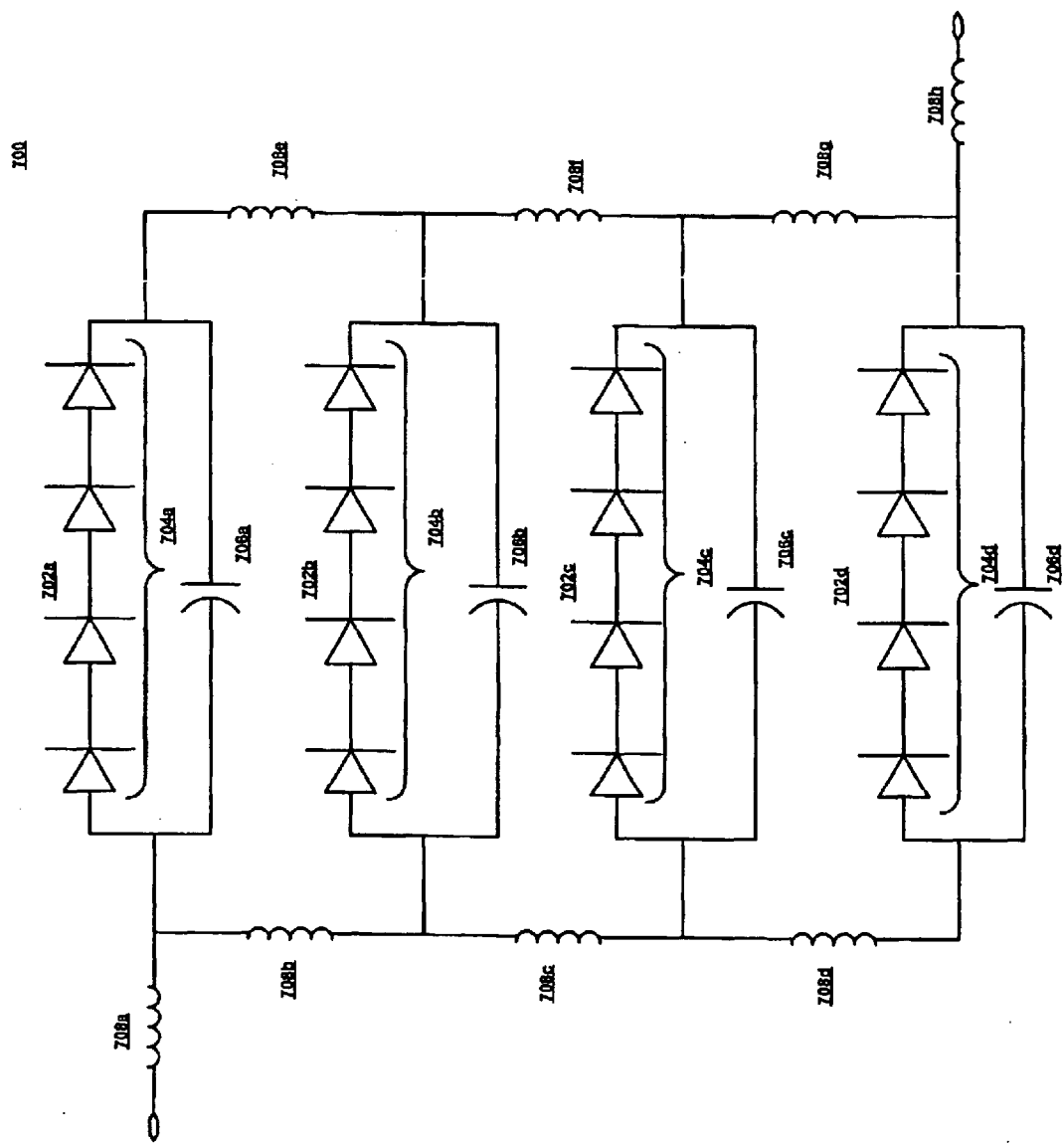
FIG. 7 is a circuit diagram of an adjustable, level-shifting network, in accordance with one embodiment of the present invention.

FIG. 7 is a circuit diagram of a diode-based level-shifting network 700, in accordance with the present invention. The level-shifting network 700 comprises one or more sections 702a–d having one or more diodes 704a–d coupled in shunt with leveling capacitors 706a–d, respectively. The number of diodes 704a–d used in the network 700 depends upon the required value of the series resistance contributed by the diodes 704a–d to achieve the desired crossover frequency response. Each section 702a–d is coupled in parallel to the other sections 702a–d and separated by inductive elements 708b–g, as shown in FIG. 7.

Figure 8:
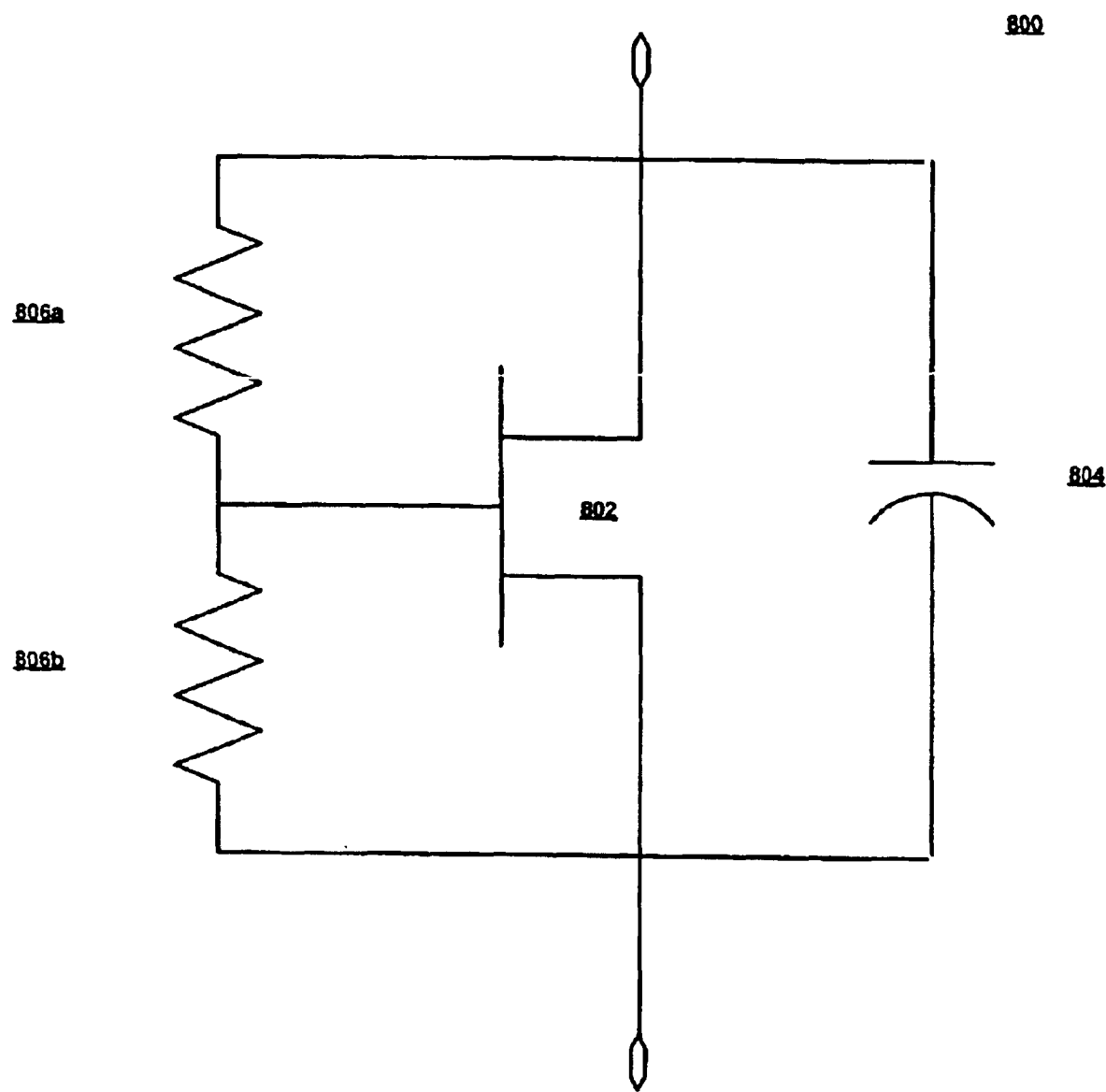
FIG. 8 is a circuit diagram of an adjustable, level-shifting network, in accordance with one embodiment of the present invention.

FIG. 8 is a circuit diagram of a transistor-based circuit 800 that can be used in place of diodes, in accordance with one embodiment of the present invention. The transistor-based circuit 800 comprises at least one transistor 802, an output capacitor 804, and bias resistors 804a–b. The transistor 803 can be a FET, BJT, or some other known transistor device. The values of the bias resistors 804a–b are selected to bias the transistor 802 to function as a diode.

Figure 9:
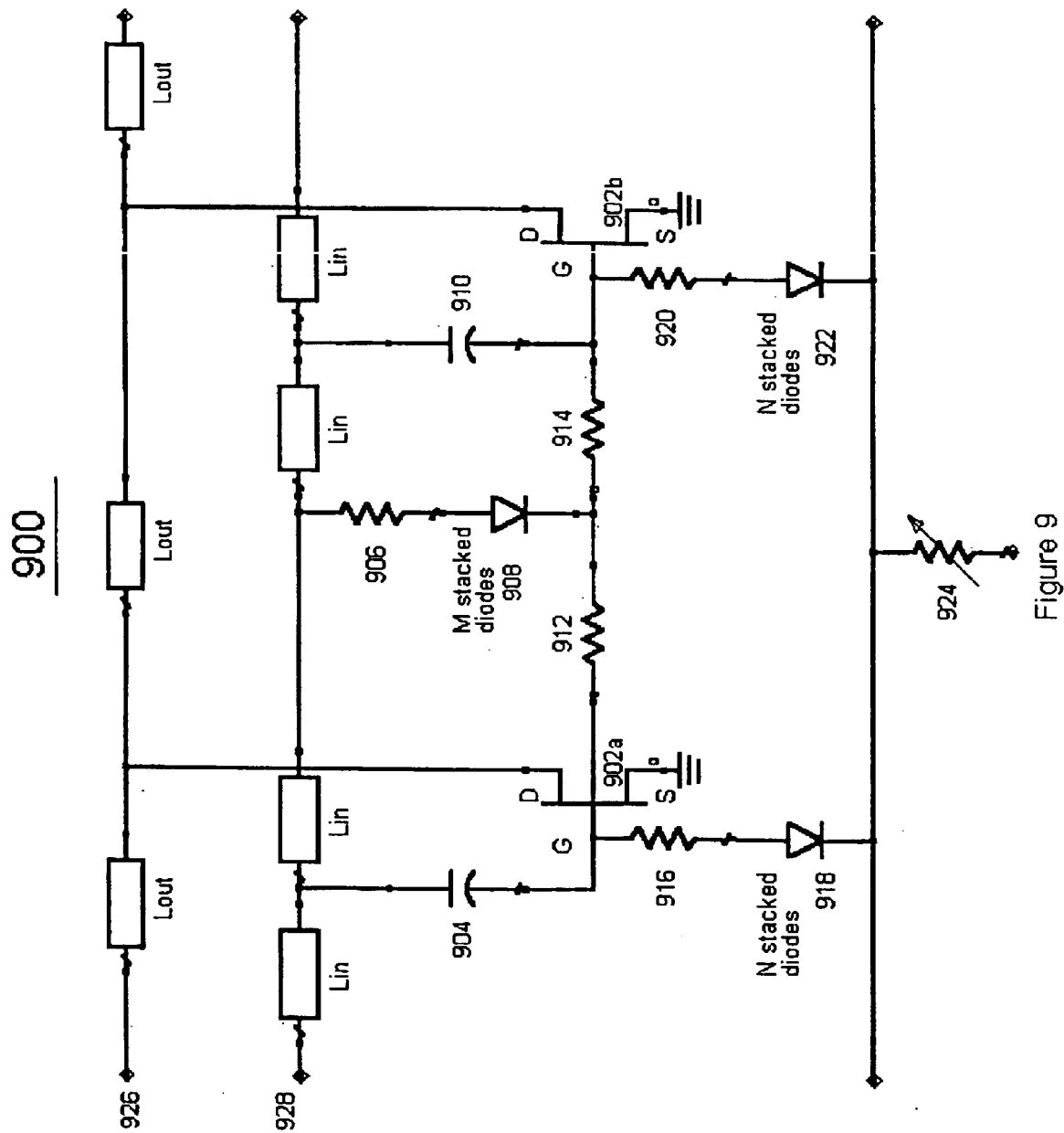
FIG. 9 is a circuit diagram of a single IC cell including an adjustable, level shifting circuit, in accordance with one embodiment of the present invention.

FIG. 9 is a circuit diagram of a single IC cell 900 including an adjustable, level shifting circuit, in accordance with one embodiment of the present invention. The cell 900 includes gain devices 902a–b, each having a drain terminal d coupled to an output transmission line 926 and a gate terminal g coupled to an input transmission line 928 via level capacitors 904 and 910. The gate terminal g of the gain devices 902a is coupled in shunt with a series resistor 916 and one or more diodes 918, which are used coupled in shunt with a series resistor 916 and one or more diodes 918, which are used for temperature compensation, as previously discussed with respect to FIG. 6. Likewise, the gate terminal g of the gain device 90b is coupled in shunt with a series resistor 920 and one or more diodes 922, which are used for temperature compensation. The diodes 918 and 922 are coupled to a variable resistor 924. To provide the proper amount of level shifting, a resistor 906 coupled in series with one or more diodes 908 is coupled between the input transmission line 928 and bias resistors 912 and 914.

In the general case, where m diodes are used with level-shifting capacitance ($C_{lev}$) and n diodes are use for temperature compensation, the crossover balance is represented mathematically as follows:

$$R_{mdiodes} = \sum_{j=1}^{m} R_{diodej}; \quad (6)$$

$$R_{ndiodes} = \sum_{j=1}^{n} R_{diodej}; \text{ and} \quad (7)$$

$$(2R_{levAi} + R_{levBi} + 2R_{mdiodes}) \times C_{levi} = (R_{Ci} + R_{ndiodei} + nR_D) * C_{Feti}, \quad (8)$$

where "n" is the number of sections of a distributed amplifier.

Figure 10:
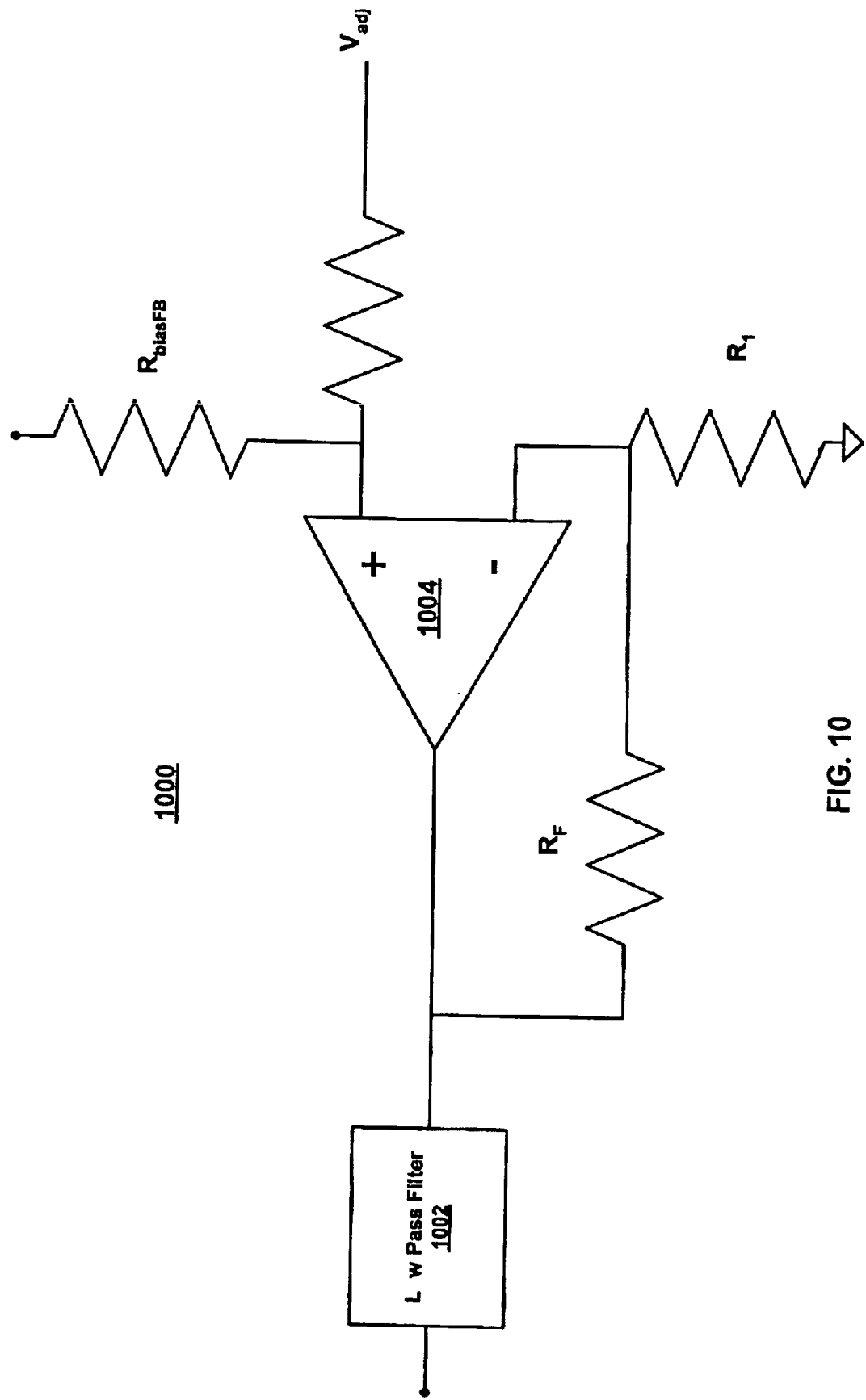
FIG. 10 is a circuit diagram of a feedback circuit, in accordance with one embodiment of the present invention.

FIG. 10 is a circuit diagram of a feedback circuit 1000, in accordance with one embodiment of the present invention; The feedback circuit 1000 includes an amplifier 1004 having a first input coupled to a sense resistor $R_{biasFB}$ (FIGS. 4 and 5) and a second input for receiving feedback from the output of the amplifier 1004. The output is also coupled to a low pass filter 1002. The feedback circuit 1000 maintains the bias current $I_{bias}$ at a desired value by sensing the de value of $I_{bias}$ and holding it constant over temperature. The feedback circuit 1000 can replace the voltage offsets 118, 412 and 512 shown in FIGS. 1, 4 and 5, respectively.

The above description is included to illustrate the operation of the preferred embodiments and is not meant to limit the scope of the invention. Rather, the scope of the invention is to be limited only by the claims. From the above discussion, many variations will be apparent to one skilled in the relevant art that would yet be encompassed by the spirit and scope of the invention.

What is claimed is:

1. An integrated circuit, comprising:
   a first amplifier having an output transmission line;
   a second amplifier having an input transmission line direct-coupled to the output transmission line of the first amplifier; and
   an adjustable, distributed level-shifting network coupled to the input transmission line of the second amplifier for providing a direct current (dc) level to the second amplifier.

2. The circuit of claim 1, wherein the adjustable, distributed level-shifting network includes a resistor-capacitor (RC) network.

3. The circuit of claim 2, wherein the RC network is coupled in series with a variable resistor and offset voltage supply, for balancing the crossover frequency response of the first and second amplifiers.

4. The circuit of claim 3, wherein the variable resistor is an active device configured to function as a variable resistor.

5. The circuit of claim 3, wherein the first amplifier and the second amplifier share the variable resistor.

6. An integrated circuit, comprising:
   an amplifier having an input and an output; and
   a level-shifting network coupled to the input of the amplifier, the level-shifting network including a level capacitor coupled in parallel with at least one diode, for providing direct current (dc) level shifting to the amplifier.

7. The circuit of claim 6, wherein the level-shifting network is coupled in series with a variable resistor for balancing the crossover frequency response of the amplifier.

8. The circuit of claim 7, wherein the variable resistor is an active device configured to function as a variable resistor.

9. The circuit of claim 6, wherein the level-shifting network is coupled to the output of the amplifier.

10. The circuit of claim 9, wherein the level-shifting network is coupled in series with a variable resistor for balancing the crossover frequency response of the amplifier.

11. The circuit of claim 10, wherein the variable resistor is an active device configured to function as a variable resistor.

12. The circuit of claim 7, wherein the variable resistor is coupled in series with at least one temperature compensating diode.

13. An integrated circuit, comprising:
an amplifier having an input and an output; and
a level-shifting network coupled to the input of the amplifier, the level-shifting network including one or more sections, each section including at least one diode coupled in parallel with at least one capacitor, for providing direct current (dc) level shifting to the amplifier.

14. The circuit of claim 13, wherein the level-shifting network is coupled in series with a variable resistor for balancing the crossover frequency response of the amplifier.

15. The circuit of claim 13, wherein the level-shifting network is coupled to the output of the amplifier.

16. The circuit of claim 13, wherein the level-shifting network is coupled in shunt with the output of the amplifier.

17. The circuit of claim 13, wherein each section of the level-shifting network includes a transistor having an input coupled to a biasing network and an output coupled in shunt with a capacitor.

18. The circuit of claim 13, wherein sections of the level-shifting network are separated by inductive elements.

19. An integrated circuit, comprising:
a cascaded amplifier having a first stage direct-coupled to a second stage, wherein each stage includes at least one gain device; and
a distributed level-shifting means coupled to at least one gain device, for providing direct current (dc) level shifting to the cascaded amplifier.

20. The circuit of claim 19, wherein the distributed level-shifting means includes a resistor-capacitor (RC) network.

21. The circuit of claim 20, wherein the RC network is coupled in series with a variable resistor and offset voltage supply, for balancing the crossover frequency response of the cascaded amplifier.

22. The circuit of claim 21, wherein the variable resistor is an active device configured to function as a variable resistor.

23. The circuit of claim 21, wherein the first amplifier and the second amplifier share the variable resistor.

24. An integrated circuit including a distributed amplifier having an input transmission line and an output transmission line, comprising:
a plurality of gain devices each having an input terminal and an output terminal, the output terminals coupled to the output transmission line;
at least one diode coupled to the input transmission line and input terminal of each gain device to provide a direct current level to the input terminal of the gain device; and
a level adjusting circuit coupled to the diodes for providing a direct current (dc) level to the gain devices.

25. The circuit of claim 24, further including;
at least one diode coupled to the level adjusting circuit for providing temperature compensation.

* * * * *